United States Patent
Laliberté

(12)

(10) Patent No.: US 6,463,743 B1
(45) Date of Patent: Oct. 15, 2002

(54) MODULAR THERMOELECTRIC UNIT AND COOLING SYSTEM USING SAME

(76) Inventor: Jacques Laliberté, 9 Jannelle Street, Napierville, Quebec (CA), J0J 1L0

( * ) Notice: Subject to any disclaimer, the term of this patent is extended or adjusted under 35 U.S.C. 154(b) by 0 days.

(21) Appl. No.: 10/094,964

(22) Filed: Mar. 12, 2002

(51) Int. Cl.[7] ............................................... F25B 21/02
(52) U.S. Cl. ............................................ 62/3.3; 62/3.6
(58) Field of Search .......................... 62/3.2, 3.3, 3.6, 62/3.62, 3.7; 165/80.3

(56) References Cited

U.S. PATENT DOCUMENTS

| | | | |
|---|---|---|---|
| 3,232,063 A | * 2/1966 | Eichhorn et al. | 62/3 |
| 4,627,242 A | 12/1986 | Beitner | 62/3 |
| 5,315,830 A | 5/1994 | Doke et al. | 62/3.2 |
| 5,398,510 A | 3/1995 | Gilley et al. | 62/3.6 |
| 5,505,046 A | 4/1996 | Nelson et al. | 62/3.6 |
| 5,661,979 A | 9/1997 | DeBoer | 62/3.6 |
| 5,699,669 A | 12/1997 | Gebhard | 62/3.64 |
| 5,784,890 A | 7/1998 | Polkinghorne | 62/3.7 |
| 6,412,286 B1 | * 7/2002 | Park et al. | 62/3.6 |

FOREIGN PATENT DOCUMENTS

JP        6-174329 A  *  6/1994  ................ 62/3.2

* cited by examiner

Primary Examiner—Denise L. Esquivel
Assistant Examiner—Melvin Jones
(74) Attorney, Agent, or Firm—Goudreau Gage Dubuc

(57) ABSTRACT

A modular thermoelectric cooling/heating unit is installed through an opening in a wall separating first and second temperature zones. This modular thermoelectric cooling/heating unit comprises a thermoelectric device including a cold surface, a hot surface, and a cooling/heating member between an electrical power supply and the cold and hot surfaces. A heat conducting block has a proximal end for thermally contacting with a first one of the cold and hot surfaces, and a distal end. A first heatsink thermally contacts with a second one of the cold and hot surfaces, a second heatsink thermally contacts with the distal end of the heat conducting block, and a thermally insulated housing covers at least a portion of the heat conducting block between the proximal and distal ends of this block. In operation, the first heatsink is located in the first temperature zone, at least a portion of the heat conducting block and the thermally insulated housing extend through the wall opening, and the second heatsink is located in the second temperature zone. The above described modular thermoelectric cooling/heating unit can be used in a modular cooling system for retrofit into an existing refrigeration unit.

25 Claims, 8 Drawing Sheets

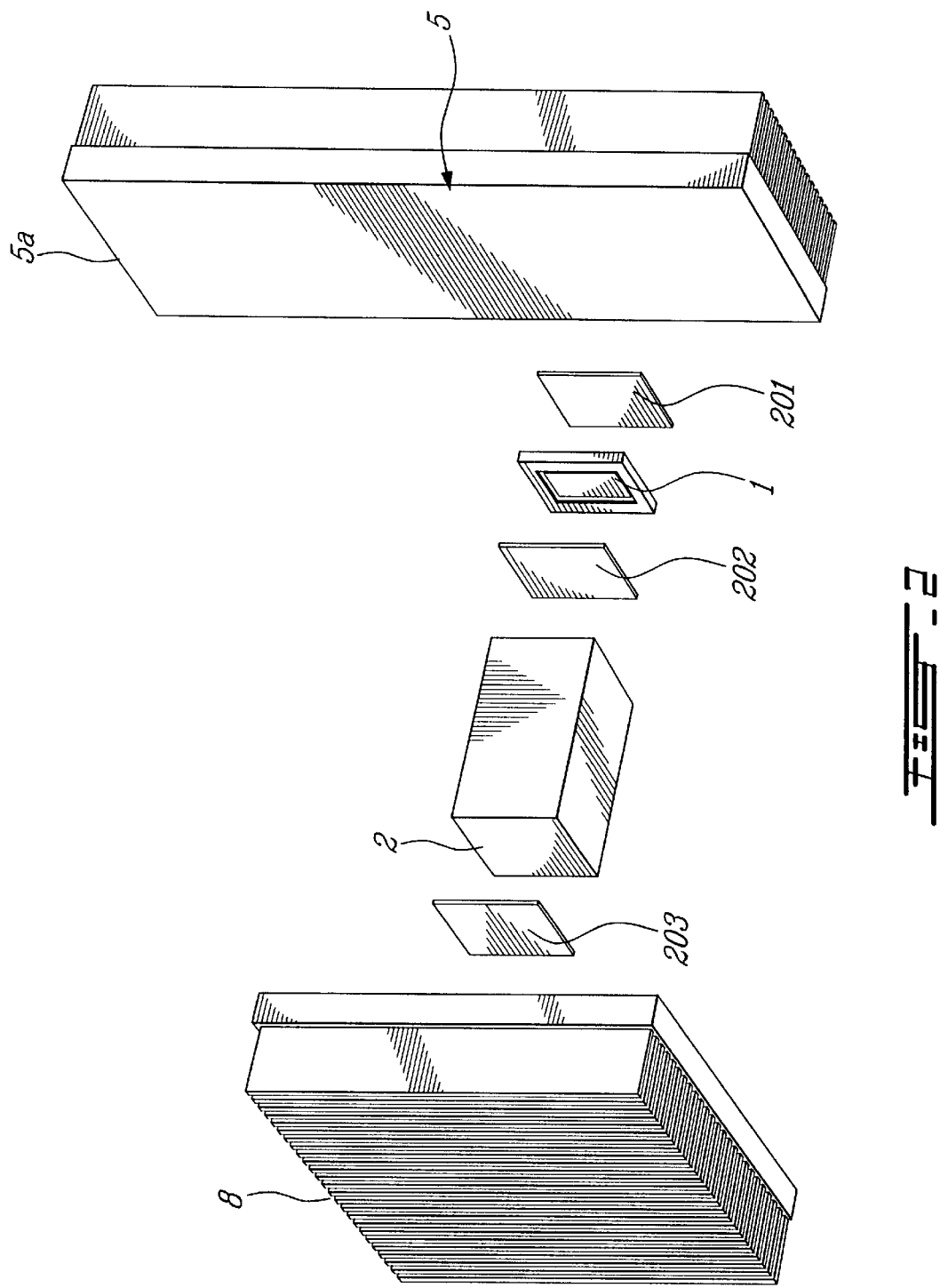

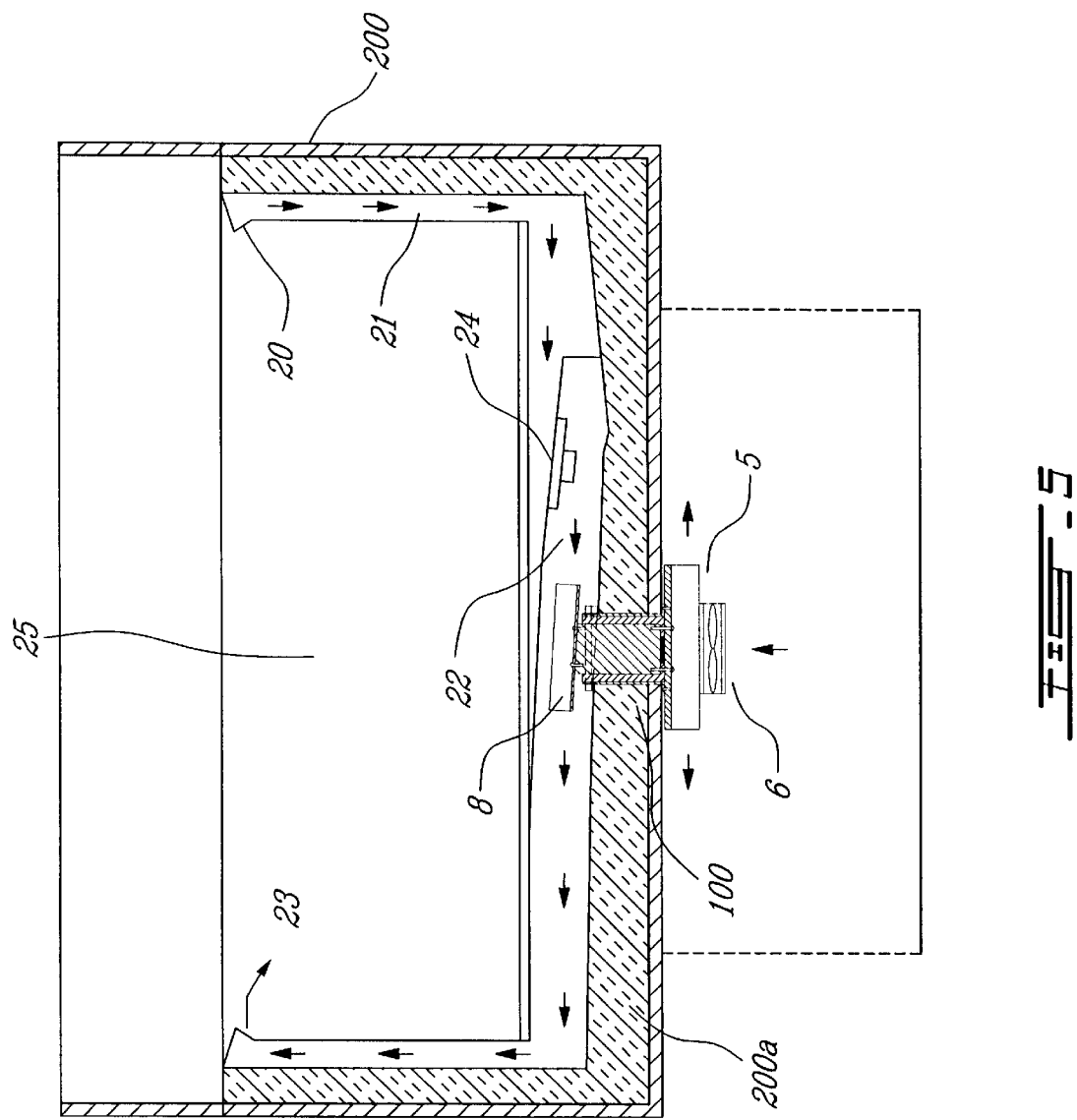

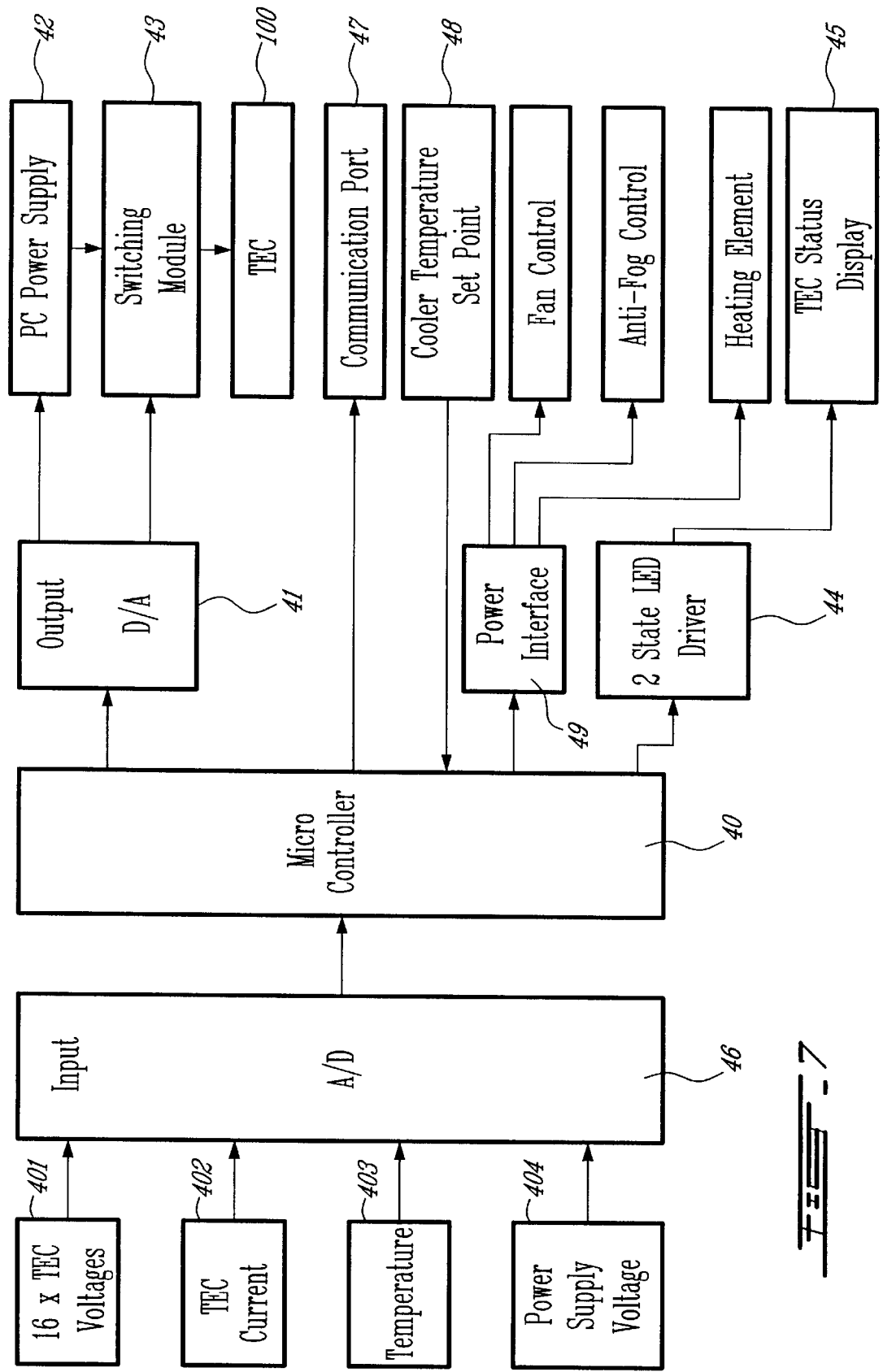

MODULAR THERMOELECTRIC UNIT AND COOLING SYSTEM USING SAME

FIELD OF THE INVENTION

The present invention relates to a thermoelectric unit for the cooling or heating of a fluid. This thermoelectric unit can be installed through an opening in a wall and is suited, in particular but not exclusively, for providing cooling for a refrigerating apparatus.

BACKGROUND OF THE INVENTION

In thermoelectric systems, one or more flat board like semiconductor devices generally known as thermoelectric coolers (TECs) transfer heat according to the Peltier effect. A direct electrical current is applied to the semiconductor device which results in a corresponding transfer of heat from one side of the semiconductor device to the other, thereby creating a cold side and a hot side.

TEC based thermoelectric systems address environmental concerns given the complete absence of a requirement for the use of heat transfer fluids such as Freon™, required in more conventional evaporating/condensing type units, while at the same time providing a lighter, more reliable and potentially less expensive apparatus. Moreover, TEC based thermoelectric systems provide for a substantial reduction in maintenance costs due to their simplicity of construction and limited number of parts. This is particularly true in the case of movable commercial apparatuses where fluid leakage frequently occurs requiring extensive and costly preventive maintenance. Also, ongoing improvements in TECs' construction and control are providing coefficient of performance (COP) figures competing with those of conventional thermodynamic systems, especially when start/stop and defrost cycles are taken into account.

Several systems have been developed over the years using a TEC device for providing the cooling required by refrigerating apparatuses, while providing numerous advantages over evaporating/condensing type units. However, use of thermoelectric units has never been contemplated in large refrigerating units such as grocery store refrigerators and coolers. Moreover, thermoelectric units are usually an integral part of the cooling or heating apparatus with few thermoelectric units being assembled in a stand-alone configuration. Of those that are assembled as complete stand-alone units, these are not designed for easy installation on an insulated wall and removal therefrom as one or more complete units.

There are many advantages to a modular concept for the thermoelectric units. For instance, the units can be easily retrofitted into existing refrigerators and coolers, providing a conversion path to solid state operation, and they can be replaced quickly in case of malfunction. Also, many small units can be used, distributed along large open-top coolers, to provide uniform spreading of the cooling capacity without requiring the addition of expensive runs of finned tubing requiring extensive maintenance (cleaning) to maintain maximal efficiency and heat transfer capacity.

A refrigeration unit implementing a number of Peltier effect devices is disclosed in U.S. Pat. No. 5,784,890 by Polkinghorne and issued on Jul. 28, 1998. As disclosed, the cooling unit requires a coolant reservoir and circulation system, cannot be easily retrofitted into an existing refrigeration apparatus and is complex and expensive to manufacture. It provides local cooling and was not designed in a manner allowing the co-operative use of multiple units to provide uniform cooling throughout the entire volume of a large refrigerating enclosure.

A thermoelectric cooling unit comprised of a Peltier effect device sandwiched between two heat sinks is disclosed in U.S. Pat. No. 5,315,830, issued to Doke et al. on May $31^{st}$, 1994. The unit as disclosed is designed to be assembled into a specially designed opening provided in the wall of a moulded plastic cooler. This cooling unit is unsuited for installation through a thick insulated panel of an existing or conventional commercial cooler given the small spacing between the hot and cold heatsinks. Furthermore, the fan on the cold side is not compatible with such an application, with the shaft acting as a conduit for moisture and providing a heat bridge between the cold and hot sides.

Similarly, the thermoelectric cooling unit disclosed in U.S. Pat. No. 5,699,669 by Gebhard and issued on Dec. $23^{rd}$, 1997, is used in a water cooler and assembled through a circular hole provided in the bottom wall of the reservoir. The unit has a threaded cylindrical cold side probe which is inserted through the hole following which a threaded mating ring is screwed thereon. Although this structure is practical in nature, it requires some adaptation in order to be used through a thick wall with its cold side exchanging heat with a gaseous environment for use in a refrigerator or cooling container. Moreover, the performance requirements for the disclosed water cooling application are far less critical than those applicable when providing refrigeration for a large subzero box cooler as contemplated in the present invention.

Although the above examples show that some modular thermoelectric cooling units exist, these thermoelectric cooling units are nevertheless lacking important features necessary for them to be useful as a readily installed modular unit for providing cooling within a thick walled enclosure. Also, no practical solution is provided in the prior art for the conversion of large elongated refrigerators, coolers or temperature holders of the type used in supermarkets to solid state cooling.

There is thus a need for a pre-assembled modular thermoelectric cooling unit which can be installed easily and rapidly through a thick insulated wall to provide cooling on one side of said wall and dissipate heat on the other side thereof. A plurality of such units are suitable for advantageously converting large refrigerating apparatuses to solid-state cooling, according to illustrative structures as contemplated in the present invention.

OBJECTS OF THE INVENTION

An object of the present invention is to provide a modular thermoelectric u nit which overcomes the above discussed limitations and drawbacks.

SUMMARY OF THE INVENTION

More specifically, in accordance with the invention as broadly claimed, there is provided a modular thermoelectric cooling/heating unit for installation through an opening in a wall separating first and second temperature zones. The wall has a given thickness and the modular thermoelectric cooling/heating unit comprises (a) a thermoelectric device for connection to an electrical power supply, this thermoelectric device comprising a cold surface and a hot surface, (b) a heat conducting block having a proximal end for thermally contacting with a first of the cold and hot surfaces of the thermoelectric device, and a distal end, (c) a first heatsink for thermally contacting with a second of the cold and hot surfaces, (d) a second heatsink for thermally contacting with the distal end of the heat conducting block, and (e) a thermally insulating housing for covering at least a portion of the heat conducting block between the proximal and distal ends of the heat conducting block. In operation, the first heatsink is located in the first temperature zone, at least a portion of the heat conducting block and the thermally insulating housing extend through the wall opening, and the second heatsink is located in the second temperature zone.

In accordance with illustrative embodiments:

at least a portion of the second heatsink is integral with the distal end of the heat conducting block;

the thermoelectric device comprises at least one Peltier effect device;

the thermoelectric cooling/heating unit further comprises insulating material within the thermally insulating housing being in close contact with the surface of the heat conducting block;

the modular thermoelectric cooling/heating unit further comprises a fan member associated with at least one of the first and second heatsinks to improve heat transfer;

the heat conducting block has a length sufficient to extend through the thickness of the wall;

the heat conducting block and the thermally insulating housing are substantially cylindrical and co-aligned along an axis substantially perpendicular to the wall;

the first heatsink has a base and the thermally insulating housing has a proximal portion for connection to the base of the first heatsink, and the thermally insulating housing has a threaded distal portion to receive a threaded ring and firmly retain the modular thermoelectric cooling/heating unit in the wall opening;

the thermoelectric cooling/heating unit further comprises an annular sealing spacer inserted between the threaded ring and the wall;

the annular sealing spacer is an annular wedge-shaped sealing spacer;

the modular thermoelectric cooling/heating unit further comprises a display of a status of the thermoelectric device; and the first surface of the thermoelectric device has a first area, the heat conducting block has a cross section with a second area larger than the first area, and the proximal end of the heat conducting block has a pyramidal shape to adapt the first area of the first surface of the thermoelectric device to the second area of the cross section of the heat conducting block.

The present invention also relates to a modular cooling system for installation onto a refrigeration unit having a fluid circulation conduit with an inlet and an outlet. This modular cooling system comprises at east one modular thermoelectric cooling/heating unit as defined hereinabove, installed through an opening in a wall of the refrigeration unit, wherein the first and second surfaces of each thermoelectric device are the cold and hot surfaces of the thermoelectric device, and wherein each second heatsink of the at least one modular thermoelectric cooling/heating unit is located within the fluid circulation conduit such that fluid entering the inlet is drawn over each second heatsink such that the temperature of the fluid at the outlet is below the temperature of the fluid at the inlet.

The modular cooling system may further comprise an controller unit, operationally connected to the electrical power supply and responding to operating conditions of the modular cooling system, this controller unit comprising a monitoring subsystem for monitoring a temperature within the refrigeration unit, a temperature of the at least one second heatsink and a voltage and a current across the at least one thermoelectric device, and a thermostatic controller for varying the current across the at least one thermoelectric device in response to fluctuations in temperature determined by the monitoring subsystem.

According to other illustrative embodiments:

the controller unit further comprises a maintenance control subsystem operationally connected to the at least one thermoelectric device for providing continuous display of a status of the at least one thermoelectric device;

the controller unit further comprises a communication interface for remote monitoring and modification of the operating conditions;

the controller unit further comprises a defrost system producing defrost cycles by reversing the voltage across the at least one thermoelectric device;

the wall is a bottom wall or a side wall of the refrigeration unit;

the at least one modular thermoelectric cooling/heating unit is installed through an opening of a side wall of the refrigeration unit and each first heatsink of the at least one modular thermoelectric cooling/heating unit includes a plurality of heat radiating fins extending generally vertically to facilitate natural convection;

each first heatsink of the at least one modular thermoelectric cooling/heating unit is located within an air conduit, advantageously a generally vertical air conduit; and the fluid comprises a gaseous fluid.

The present invention further relates to a cooling/heating system comprising a housing, a thermally insulating partition, at least one thermoelectric cooling/heating unit as described hereinabove, and first and second fluid circulating members. The thermally insulating partition is situated in the housing to divide that housing into first and second conduits, the first conduit comprising a first inlet and a first outlet and the second conduit comprising a second inlet and a second outlet. The thermoelectric cooling/heating unit(s) are installed through an opening(s) in the thermally insulating partition with the first heatsink(s) located in the first conduit and the second heatsink(s) located in the second conduit. The first fluid circulating member is associated to the first conduit and produces a first fluid stream in the first conduit from the first inlet to the first outlet whereby heat exchange is conducted between the first fluid stream and the first heatsink(s). The second fluid circulating member is associated to the second conduit and produces a second fluid stream in the second conduit from the second inlet to the second outlet whereby heat exchange is conducted between the second fluid stream and the second heatsink(s).

The foregoing and other objects, advantages and features of the present invention will become more apparent upon reading of the following non restrictive description of illustrative embodiments thereof, given for the purpose of illustration only with reference to the accompanying drawings:

BRIEF DESCRIPTION OF THE DRAWINGS

In the appended drawings:

FIG. 2 is a schematic exploded view showing the main components of an illustrative embodiment of the modular thermoelectric cooling unit of the present invention using a single Thermoelectric Peltier Effect Device (TEC);

FIG. 5 is a cross sectional side view of an air circulating open top cooler including at least one modular thermoelectric cooling unit according to the present invention;

FIG. 7 is a schematic block diagram of a supply/control unit used in co-operation with modular thermoelectric cooling units to effect refrigeration in a cooling apparatus such as illustrated in FIGS. 5 and 6.

DETAILED DESCRIPTION OF ILLUSTRATIVE EMBODIMENTS

Figure 1:
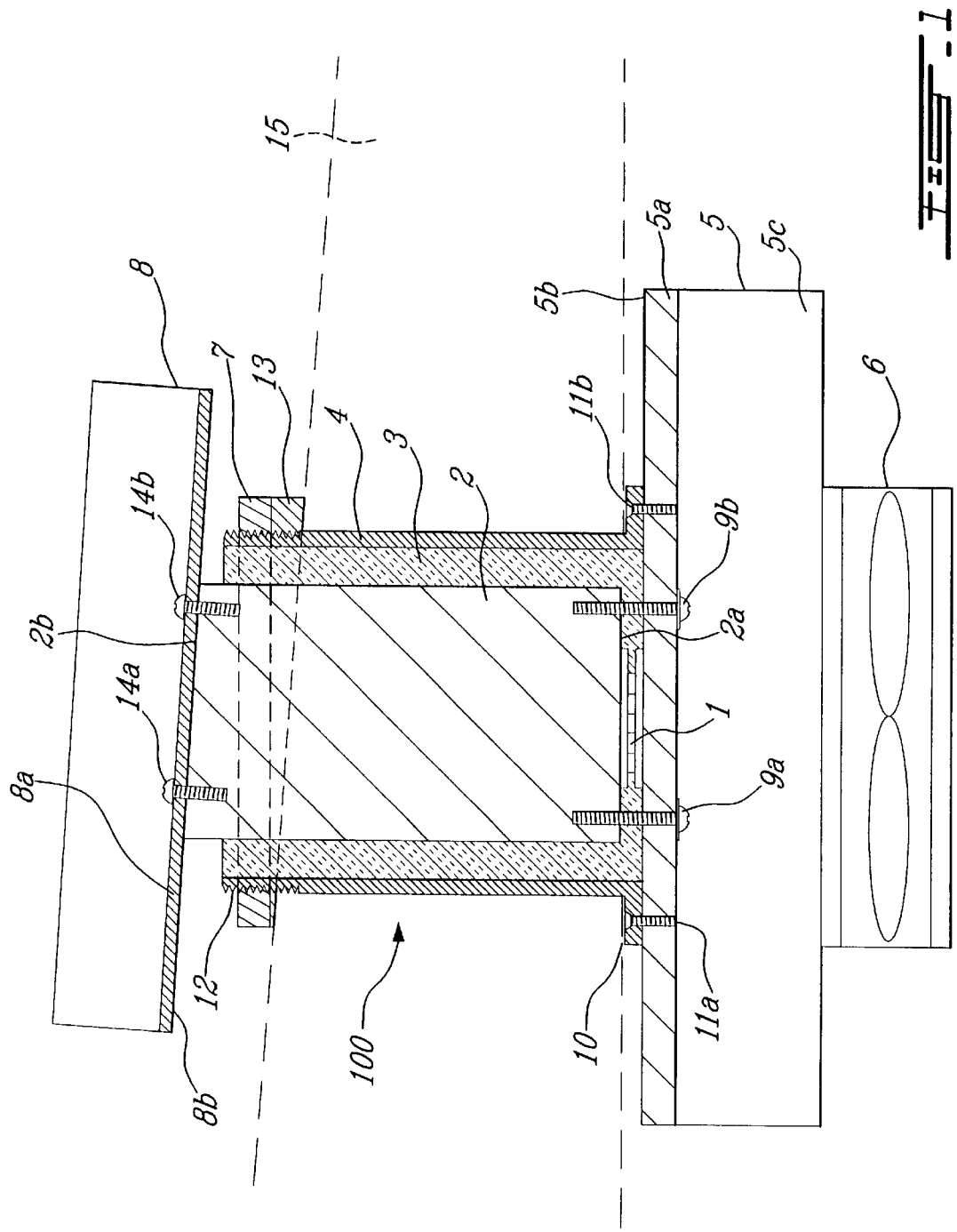
FIG. 1 is a longitudinal cross sectional view of an illustrative embodiment of the modular thermoelectric cooling unit of the present invention.
Figure 3A:
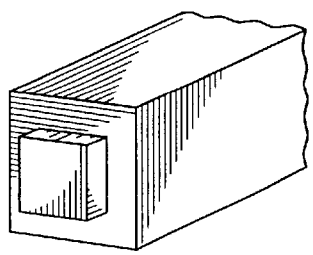
FIG. 3a is a first illustrative shape for a thermoconductive spacer block for a modular thermoelectric cooling unit according to the present invention.
Figure 3B:
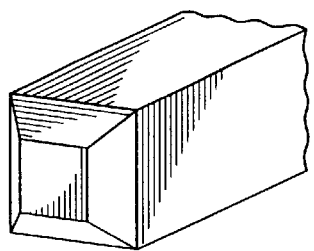
FIG. 3b is a second illustrative shape for a thermoconductive spacer block for a modular thermoelectric cooling unit according to the present invention.
Figure 3C:
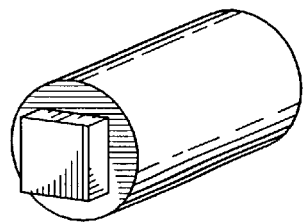
FIG. 3c is a third illustrative shape for a thermoconductive spacer block for a modular thermoelectric cooling unit according to the present invention.
Figure 3D:
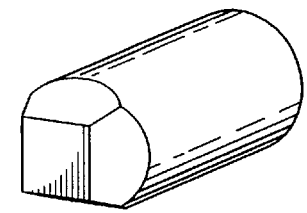
FIG. 3d is a fourth illustrative shape for a thermoconductive spacer block for a modular thermoelectric cooling unit according to the present invention.

Similar parts in the various figures of the appended drawings are identified by the same reference numerals.

Illustrative embodiments of the modular thermoelectric cooling unit according to the present invention will now be described in detail with reference to the appended drawings.

Referring to FIG. 1, there is illustrated a modular thermoelectric cooling/heating unit generally identified by the reference 100 and comprising a TEC device 1 sandwiched between a finned heatsink 5 and a heat conducting block 2.

Since TEC devices normally have hot and cold side square surfaces, optimal thermal transfer occurs when the end face of heat conducting block 2 facing the TEC device 1 has substantially the same shape and size. Therefore, a heat conducting block 2 with a square cross section can be considered. However, optimal thermal transfer also requires the cross section of heat conducting block 2 to be generally larger than the cross section of the hot or cold surface of the TEC device 1. It is thus allowable to use a heat conducting block 2 having a generally circular cross section. The latter, generally circular cross section can present an area equivalent to a square cross section with sides of about 2.5 inches. Of course, the end face of the heat conducting block 2 adjacent to the TEC device 1 must present a shape and size similar to those of the corresponding hot or cold surface of the TEC device 1. Unless TEC devices of very large sizes are used, the heat conducting block 2 may, for example, be ended with a pyramidal shape. Illustrative examples of such pyramidal shape are illustrated in FIGS. 3a, 3b, 3c, and 3d.

Heatsink 5 (FIGS. 1 and 2) comprises a flat base 5a assembled to a proximal end face 2a of the heat conducting block 2, with the TEC device 1 sandwiched therebetween. More specifically, the flat base 5a is fastened to the end face 2a through thermally insulating screws such as 9a and 9b.

For example, these screws 9a and 9b may be made of a thermally insulating material such as Teflon and Nylon. In the illustrative embodiment illustrated in FIG. 1, the cold surface of the TEC device 1 is applied to end face 2a of the heat conducting block 2 while the hot surface of the TEC device 1 is applied to face 5b of the flat base 5a so that heatsink 5 is a hot heatsink. Alternatively, heat conducting adhesive can be applied on the opposite hot and cold surfaces of the TEC device 1, providing however less thermal transfer and lower efficiency due to the low thermal conductivity of currently available suitable adhesives. Face 5b of the heatsink base 5a and end face 2a of the thermoconductive block 2 in thermal contact with the hot and cold surfaces of the TEC device 1, respectively, are polished and a thin layer of thermally conductive compound or a thermally conductive thin pad (see 201 and 202 in FIG. 2) is, for example, inserted at each interface, in the case where thermally insulating screws such as 9a and 9b are used, to provide the best possible heat transfer characteristic.

The main thermally conductive parts (heat conducting block 2 and heatsinks 5 and 8) are advantageously made of high conductivity metal such as nearly pure copper or aluminium. It should be noted that the heat conducting block 2 typically has an overall length of approximately 3 inches in order to transfer heat across a thick insulated wall of a typical cooling apparatus.

Although satisfactory results have been obtained using a solid block 2 of 1060 aluminium or copper, in an alternative embodiment the heat conducting block 2 could be replaced with a two phase heat pipe system should further improved heat transfer performance be required, especially when implemented in a cooling apparatus for low temperature applications below −18° C. Experience has shown that proper dimensioning and material selection in a basic solid metal block system enable pumping more than 20 watts of heat through the modular thermoelectric cooling/heating unit 100, with a temperature differential of 40° C. between the cold 8 and hot 5 heatsinks. Actual performance of the thermoelectric cooling/heating unit 100 also depends on the performance of the TEC device 1 itself and better performance may generally be obtained by using multistage Peltier effect devices, or by replacing the TEC device 1 by cascaded Peltier effect devices comprised of at least two single stage units separated by an additional thermally conductive pad.

The modular thermoelectric cooling/heating unit 100 comprises a generally cylindrical housing 4 formed at one end with an annular flange 10 and at the other end with an externally threaded portion 12. The flange 10 is fastened to the face 5b of the flat base 5a of heatsink 5 on the side opposite to the fins 5c using screws such as 11a and 11b. As illustrated in FIG. 1, the housing 4 axially surrounds the heat conducting block 2. The externally threaded portion 12 receives a mating internally threaded locking ring 7. The housing 4 is, for example, made of moulded thermoplastic material. The space between the assembly including the heat conducting block 2, the TEC device 1 and the flat base 5a, and the inner wall of the housing 4 is filled with a high performance thermally insulating material 3 such as injected polyurethane foam so as to avoid air circulation and prevent heat transfer from the heat conducting block 2 through the housing 4 to the external environment.

The distal end of heat conducting block 2 opposite to the proximal end 2a can be formed with a sloped end surface 2b having angle of the order of, for example, 5° to match, for example, the angle of the bottom surface of a cooler.

Therefore, the modular thermoelectric unit 100 can be readily installed, for example, in a circular opening made in the bottom wall 15 of a commercial open-top cooler (200 in FIG. 4). For that purpose, the housing 4 is inserted in the circular opening from one side of wall 15. Then, if the wall 15 has opposite non parallel wall surfaces, an optional wedge-shaped annular sealing spacer 13 is positioned on the threaded portion 12 on the other side of wall 15; the sealing spacer 13 is simply annular in the case of a wall 15 with opposite parallel wall surfaces. Ring 7 is then screwed on the externally threaded portion 12. The flat base 8a of the cold heatsink 8 can thereafter be assembled on the distal end face 2b of the heat conducting block 2 by means of screws such as 14a and 14b to further improve heat transfer. Again, mating surface 8b of the heatsink base 8a and mating end face 2b of the heat conducting block 2 are polished and a heat conductive compound or pad (203 in FIG. 2) applied between these mating surfaces. Screws such as 14a and 14b secure the cold heatsink flat base 8a on the distal end face 2b of the heat conducting block 2 providing good thermal contact. The modular thermoelectric unit 100 may possibly comprise a fan blower 6 mounted to the hot heatsink 5 in the proximity of the fins 5c to improve heat dissipation.

Cold heatsink 8 as illustrated in the appended drawings is a part different from heat conducting block 2. However, it is within the scope of the present invention to provide a heatsink 8 integral with the distal end of the heat conducting block 2. For example, heatsink 8 can be simply formed by the distal end face 2b of the heat conducting block 2. Heatsink 8 can also be formed by an extension of the distal end of the heat conducting block 2 on said other side of wall 15. Moreover, this extension of the distal end of the heat conducting block 2 can be formed with fins or similar structure to improve the heat transfer characteristic of the heatsink 8.

Figure 4A:
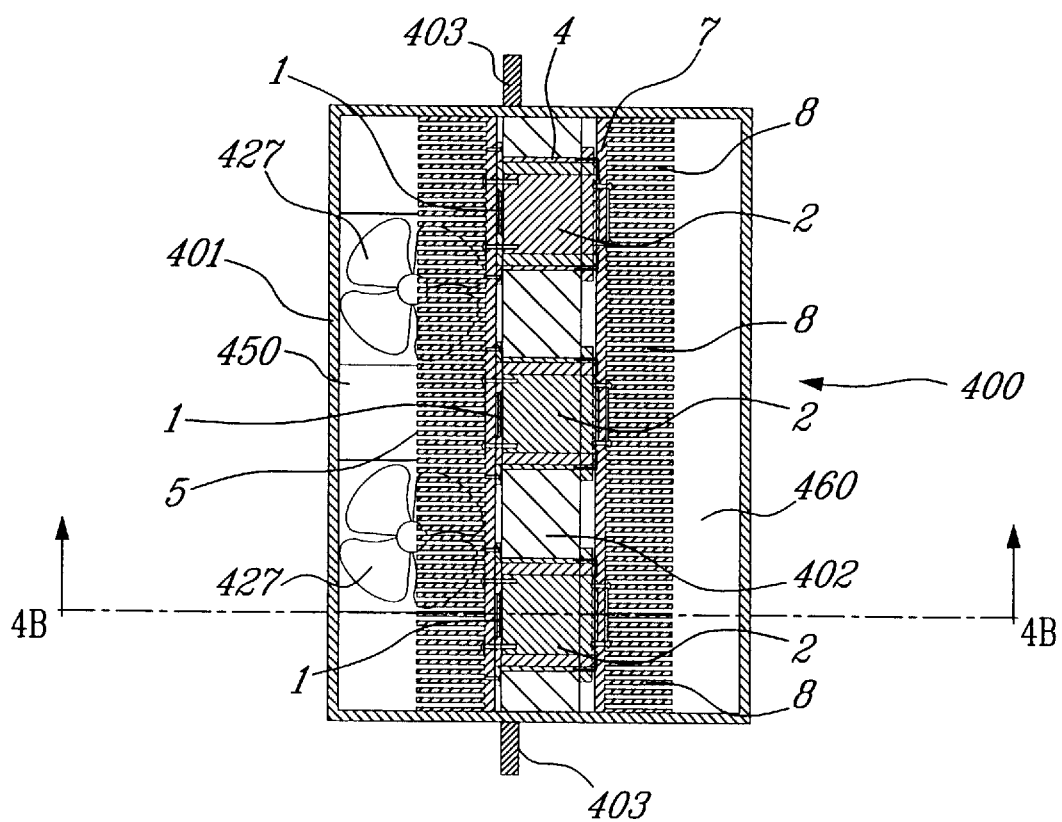
FIG. 4a is a cross sectional, top view of a cooling/heating module comprising six modular thermoelectric cooling units according to the present invention.
Figure 4B:
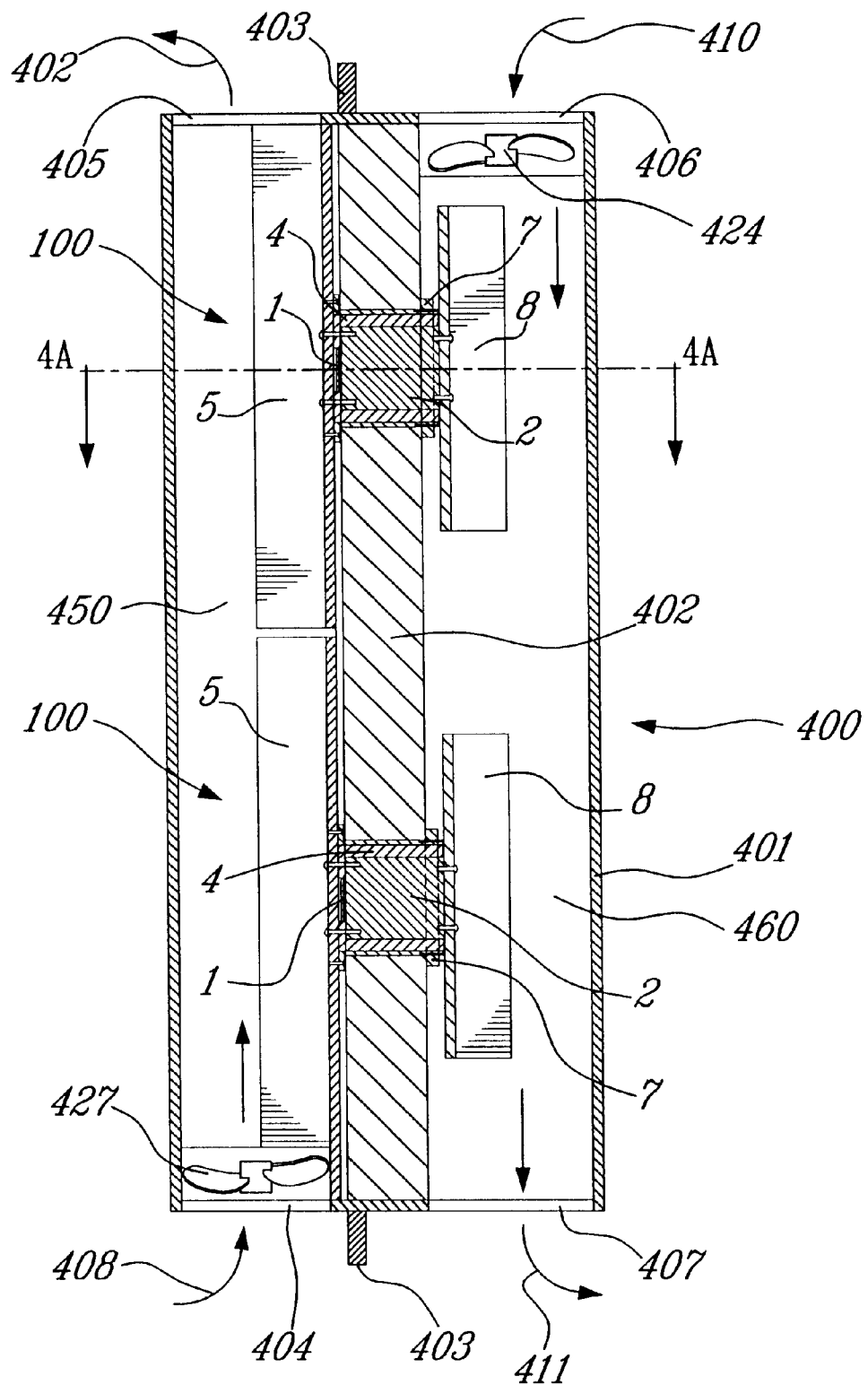
FIG. 4b is a cross sectional side view of the cooling/heating module of FIG. 4a, comprising six modular thermoelectric cooling units according to the present invention.

Referring now to FIGS. 4a and 4b, a cooling/heating module 400 comprises six thermoelectric units 100 as described hereinabove. Module 400 further comprises a housing 401 including a thermally insulating partition 402 dividing this housing into conduits 450 and 460. Housing 401 further comprises mounting flanges such as 403. Hot side conduit 450 includes a hot side inlet 404 provided with fans 427 and a hot side outlet 405. Cold side conduit 460 comprises a cold side inlet 406 provided with fans 424 and a cold side outlet 407. Module 400 also comprises a power supply/controller unit (not shown) providing electrical supply and controlling thermoelectric units 100. Module 400 is destined to be mounted, using flanges 403, in an opening across a wall of an apparatus to be either cooled or heated.

In operation, heat is pumped from the cold side to the hot side by thermoelectric units 100 in module 400: A first air stream 408 is generated in hot side conduit 450 by the fans 427 at the hot side inlet 404 to cool hot heatsinks 5 and to be evacuated as a hot air stream 409 through hot side outlet 405. In the same manner, a second air stream 410 is generated in the cold side conduit 460 by the fans 424 at cold side inlet 406 to heat (pick up cold) from cold heatsinks 8 and to be evacuated as a cold air stream 411 through cold side outlet 407. Therefore, heat can be pumped from an apparatus to external ambient air or vice versa using a rapidly and easily installed module 400 though a single opening in a wall of said apparatus. The number of modular thermoelectric units 100 comprised into module 400 is determined as a function of the thermal requirements of the apparatus such that a single module 400 is usually required.

Alternatively, each one of air stream 409 and air stream 410 can be replaced by streams of another gaseous or liquid fluid, and more particularly by a fluid such as water having a liquid phase in operation conditions, and each one of fans 424 and 408 could accordingly be replaced by a pump member adapted to pump liquid. Therefore, module 400 could be used in a cooling apparatus having either a gas or liquid phase heat transport medium, and could have its hot side cooled by a liquid medium to further improve heat extraction and COP.

FIG. 5 shows the modular thermoelectric unit 100 of the present invention installed in the bottom wall 200a of an open-top commercial cooler 200 as previously described. In practice, a plurality of such units are required for proper operation of the cooler, i.e. up to 16, 32 or more, depending on the size of the cooler, heat capacity requirements and power rating of the units. The units 100 are controlled by a power supply/controller system illustrated in FIG. 7 and described hereinafter.

Referring again to FIG. 5, warmer air on top of the cooling cavity 25 is drawn through an air inlet 20 and conduit 21 under the action of a fan 24 (in practice a plurality of such fans are distributed along the length of cooler 200) and directed into a conduit 22 under the floor of the cooler, where the cold heatsinks 8 of units 100 are mounted. The air stream is cooled by contact with said heatsinks 8 and follows the conduit 22 up to an air outlet 23 which diffuses said cooled air through a flow dividing grid into a laminar flow returning to the cavity 25 along a longitudinal wall thereof. The heat extracted from the air stream is electronically pumped through the bottom wall 200a and dissipated beneath the cooler via the heatsinks 5 and associated fan blowers 6. Excluding that the condenser coils of a conventional cooling unit have been replaced by the heatsinks 8 coupled to units 100 and an appropriate controller, the structure and operation of the cooler 200 basically remains the same as a conventional unit. In actual fact, modular thermoelectric units 100 provided with their own hot heatsink fan blowers 6 may be retrofitted into an existing cooler 200 by simply cutting circular openings in the bottom wall 200a.

Figure 6:
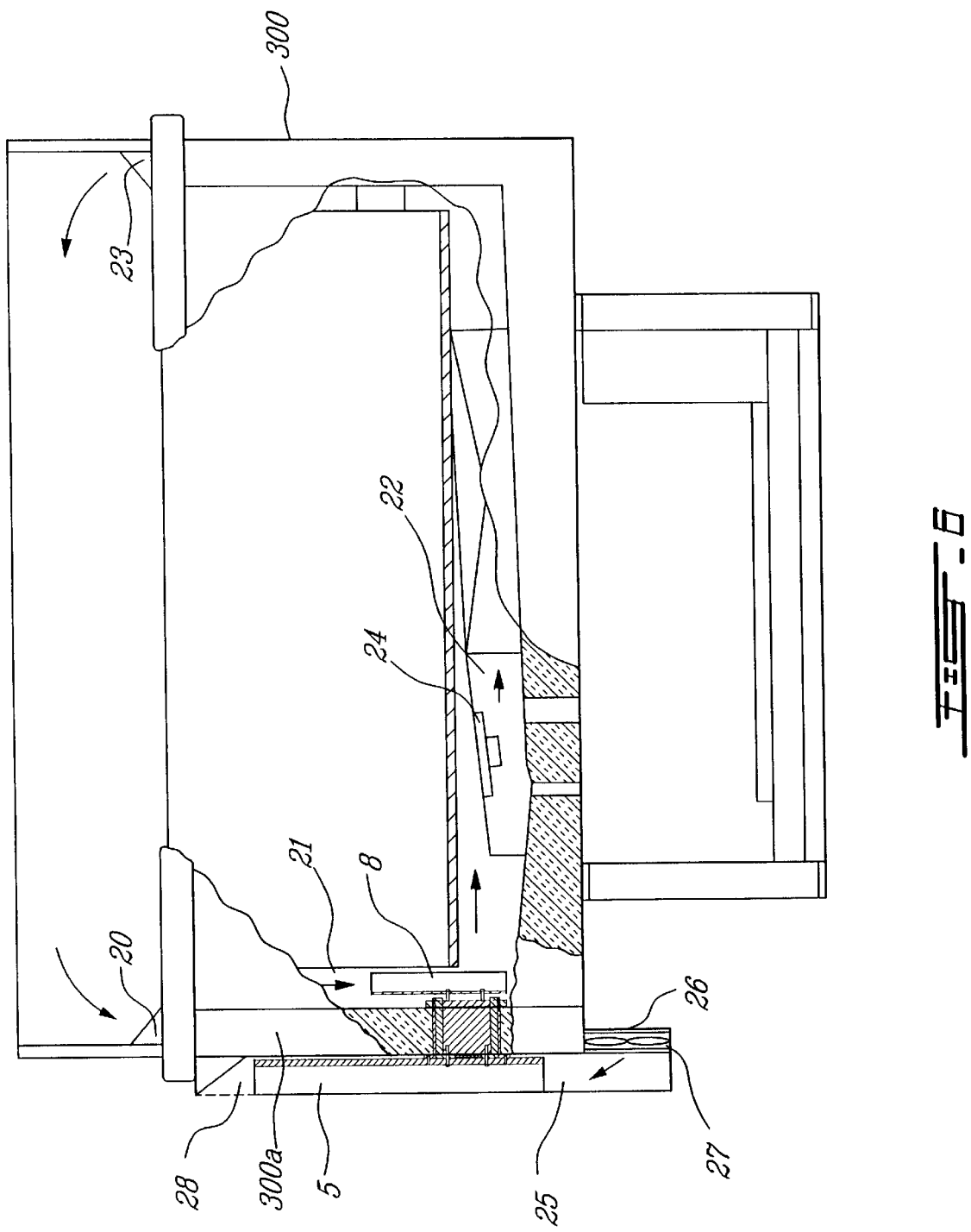
FIG. 6 is a cross sectional side view of an air circulating open top cooler operating with at least one modular thermoelectric cooling unit according to a further illustrative embodiment of the present invention.

An alternative embodiment of a thermoelectric cooling apparatus 300 using modular thermoelectric units 100 of the present invention is illustrated in FIG. 6. In this embodiment, the units 100 have been installed on a vertical wall 300a with the cold heatsinks 8 located in the air intake conduit 21 and the hot heatsinks 5 located in individual ports 25 with their fins oriented vertically. The air drawn by the fan 24 enters the air intake conduit 21 via upper inlet 20, is cooled by contact with the cold heatsinks 8, passes through the fan 24 and follows the conduit 22, finally exiting by upper outlet 23 as previously described. For each unit 100, the chimney effect acting in the corresponding heat dissipation conduit 25 and emphasised by the forced convection created by blower 27, provides a high velocity flow of ambient air entering at inlet 26, which extracts heat from the hot heatsinks 5 and exits the heat dissipation conduit 25 via outlet 28 as warm air. This arrangement provides improved heat dissipation with respect to the embodiment of FIG. 2, at the cost of more substantial modifications being required to the original conception and structure of the existing cooling apparatus.

Turning now to FIG. 7, there is illustrated a schematic block diagram of the power supply/controller system contemplated for operating a cooling apparatus using a plurality of thermoelectric units 100 as provided herein.

Although the illustrated system is designed for operation with a bank of sixteen (16) units, any number of units can be accommodated by making appropriate adjustments in the number of input/outputs, drivers, wiring etc. Proper operation of the system and accurate control of the temperature is accomplished under the control of a microcontroller 40. All of the sixteen (16) thermoelectric units 100 are individually connected to a variable voltage DC power supply 42 through a switching module 43. The power supply has a capacity of nearly 200 VDC so that the units are normally connected in series. However, the voltage 401 across each TEC device, the current 402 supplied to each TEC device, the temperatures 403 in the cooler cavity, at the hot heatsinks 5 and at the cold heatsinks 8, and the power supply voltage 404 from power supply 42 are monitored by the microcontroller 40 via appropriate sensing probes connected to an input module 46 comprising an analog-to-digital converter.

Should a TEC device of a unit 100 become defective or commence overheating, the local voltage drop will increase and the loop current will decrease. The microcontroller 40 will then activate the switching module 43 through an output module 41 incorporating a digital-to-analog converter to electrically bypass the defective unit (performance of less than 60% for instance) and reduce the supply voltage accordingly to maintain the other units in operation within their optimal working range. Also, a signal will be sent by the microcontroller 40 to the two-state LED (light-emitting-diode) driver 44 and LED display 45 to identify the faulty unit. Otherwise, the current supply to the units 100 remains uninterrupted, with the voltage being smoothly modulated to maintain the temperature at a set point with negligible hysteresis.

Alternatively, similar results with specific advantages would be obtained by using a modulated direct current (DC) supply in lieu of a DC voltage supply and/or by connecting the units 100 in a series/parallel arrangement. An advantage of using a current source for instance, is that better control of the power output of TEC devices is provided since the current in a device becomes independent from variations in the device's impedance. In an example embodiment, sixteen units could be connected in eight parallel banks of two serially connected units. The eight banks could also be connected to common or different DC current sources in order to enable operation of specific banks at different current settings, as would be required to provide accurate temperature control in individual zones of a cooling apparatus. In such a case, one current source per zone could be used to supply one or more banks of units, the amplitude of each current source being continuously and smoothly modulated to maintain the set temperature in the corresponding zone. Since units 100 tend to become electrically open upon failure, connecting the units or banks of units in parallel may additionally enable a cooling apparatus to remain in operation when such a failure occurs, without the help of a sophisticated electronic bypass module.

A communication port 47 is provided to enable remote sensing and modification of the cooler temperature set point 48, which may prevent unnecessary displacements of a supervisor or maintenance team, thus saving costs. The system is completed by a power interface 49 which controls accessory items such as fans and anti-fog heating elements. Amongst additional automatic control features, —microcontroller 40 occasionally commands the power supply 42 to reverse polarity for a few minutes, placing thermoelectric units 100 in a heating mode in order to defrost the cold heatsinks 8. It shall be noted that the operation is much faster and requires less energy than evaporating/condensing systems and does not cause substantial reduction in cooler temperature.

Also, it should be noted that the cold and hot sides of the TEC devices can be inverted or the polarity of the supply voltage of the TEC devices can be inverted to thereby invert the cold and hot heatsinks to transform the apparatus from a cooling apparatus to a heating apparatus.

One can easily appreciate that the above described embodiments of the present invention provide an effective solution for the replacement of evaporating/condensing cooling systems in commercial and especially mobile coolers and holder counters with numerous advantages. Particularly, the modular construction of the distributed low power units makes manufacturing, installation and maintenance easy and cost effective, which, along with improved control features, brings unmatched economic and functional performance.

Therefore, it can be seen that the modular thermoelectric units and associated cooler systems using same according to the present invention can be advantageously used in miscellaneous cooling/heating applications with numerous advantages over the solutions of the prior art. For example fluids other than air can be cooled or heated. For instance, cooling systems according to the present invention could be used in apparatuses such as drinking water coolers, bottled liquids (bottles of wine, beer, soft drinks, biological cultures . . . ) liquid cooling apparatuses, heat dissipating equipment cooling apparatuses, etc.

The modular thermoelectric units according to the present invention present, amongst others, the following advantages:

- the modular thermoelectric unit comprising at least one TEC device and heatsinks efficiently transfer heat from one side of the unit to the other side thereof, in a direction depending upon the polarity of the applied direct electrical current;
- the modular thermoelectric unit can be easily installed across a thick insulated wall through a circular cut-out, without requiring the use of any fasteners in the wall;
- the modular thermoelectric unit can be installed on the bottom or side wall of a refrigerating apparatus of conventional construction to enable operation substantially below 0° C. with thermoelectric cooling in lieu of a conventional evaporating/condensing cooling unit;
- the modular thermoelectric unit comprises a thermally and electrically insulated housing to prevent thermal and electrical contact of the heatsinks and heat conducting block with any part of the wall through which it is installed, as well as undesired heat transfers with the atmosphere, for optimal energetic performance;
- the modular thermoelectric unit can be provided with a fan on the hot heatsink thereof to improve heat dissipation when used as a cooling unit;
- the thermoelectric unit is simple and relatively cheap to manufacture, is quiet in operation and generally environmentally friendly while still providing a good coefficient of performance;
- an air circulating open top cooler of conventional construction can be provided with a plurality of modular thermoelectric units according to the present invention, electrically connected in series to a common high voltage power supply;
- an air circulating open top cooler can be provided with a plurality of modular thermoelectric units according to the present invention and with improved forced convection heat dissipation means to enable low temperature operation;
- the thermoelectric units can be provided with a controller enabling precise temperature control through monitoring of the cooled environment temperature, hot and cold heatsink temperature and individual voltage drops and current across thermoelectric devices, and by individual control of the thermoelectric device interconnections; and the modular thermoelectric units can be provided with a controller to facilitate maintenance by providing continuous display of the thermoelectric devices status, to provide short and low energy defrost cycles without significantly affecting the temperature of the cooled region, and to provide communication links to enable remote monitoring and modification of operating conditions.

Although the present invention has been described by means of illustrative embodiments thereof, it is contemplated that various modifications may be made thereto without departing from the spirit and scope of the present invention. Accordingly, it is intended that the embodiment described be considered only as illustrative of the present invention and that the scope thereof should not be limited thereto but be determined by reference to the claims hereinafter provided and their equivalents.

What is claimed is:

1. A modular thermoelectric cooling/heating unit for installation through an opening in a wall separating first and second temperature zones, said wall having a given thickness and said modular thermoelectric cooling/heating unit comprising:

a thermoelectric device for connection to an electrical power supply, said thermoelectric device comprising a cold surface and a hot surface;

a heat conducting block having a proximal end for thermally contacting with a first of said cold and hot surfaces of the thermoelectric device, and a distal end;

a first heatsink for thermally contacting with a second of said cold and hot surfaces;

a second heatsink for thermally contacting with the distal end of the heat conducting block; and a thermally insulating housing for covering at least a portion of the heat conducting block between the proximal and distal ends of said heat conducting block;

wherein, in operation, the first heatsink is located in the first temperature zone, at least a portion of the heat conducting block and the thermally insulating housing extend through the wall opening, and the second heatsink is located in the second temperature zone.

2. The modular thermoelectric cooling/heating unit of claim 1 wherein at least a portion of the second heatsink is integral with the distal end of the heat conducting block.

3. The modular thermoelectric cooling/heating unit of claim 1 wherein the thermoelectric device comprises at least one Peltier effect device.

4. The modular thermoelectric cooling/heating unit of claim 1 further comprising insulating material within said thermally insulating housing being in close contact with the surface of the heat conducting block.

5. The modular thermoelectric cooling/heating unit of claim 1 further comprising a fan member associated with at least one of the first and second heatsinks to improve heat transfer.

6. The modular thermoelectric cooling/heating unit of claim 1 wherein said heat conducting block has a length sufficient to extend through the thickness of the wall.

7. The modular thermoelectric cooling/heating unit of claim 1 wherein said heat conducting block and said thermally insulating housing are substantially cylindrical and co-aligned along an axis substantially perpendicular to the wall.

8. The modular thermoelectric cooling/heating unit of claim 1 wherein said first heatsink has a base and said thermally insulating housing has a proximal portion for connection to said base of the first heatsink, and wherein the thermally insulating housing has a threaded distal portion to receive a threaded ring and firmly retain the modular thermoelectric cooling/heating unit in the wall opening.

9. The modular thermoelectric cooling/heating unit of claim 7 further comprising an annular sealing spacer inserted between the threaded ring and said wall.

10. The modular thermoelectric cooling/heating unit of claim 8 wherein the annular sealing spacer is an annular wedge-shaped sealing spacer.

11. The modular thermoelectric cooling/heating unit of claim 1 further comprising a display of a status of the thermoelectric device.

12. The modular thermoelectric cooling/heating unit of claim 1, wherein said first surface of the thermoelectric device has a first area, wherein the heat conducting block has a cross section with a second area larger than the first area, and wherein the proximal end of the heat conducting block has a pyramidal shape to adapt the first area of said first surface of the thermoelectric device to the second area of the cross section of the heat conducting block.

13. A modular cooling system for installation onto a refrigeration unit having a fluid circulation conduit with an inlet and an outlet, the modular cooling system comprising:

at least one modular thermoelectric cooling/heating unit as defined in claim 1, installed through an opening in a wall of the refrigeration unit, wherein said first and second surfaces of each thermoelectric device are the cold and hot surfaces of said thermoelectric device;

wherein each second heatsink of said at least one modular thermoelectric cooling/heating unit is located within the fluid circulation conduit such that fluid entering the inlet is drawn over each second heatsink such that the temperature of the fluid at the outlet is below the temperature of the fluid at the inlet.

14. The modular cooling system as in claim 12 further comprising:

a controller unit, operationally connected to said electrical power supply and responding to operating conditions of the modular cooling system, said controller unit comprising:

a monitoring subsystem for monitoring a temperature within the refrigeration unit, a temperature of the at least one second heatsink and a voltage and a current across the at least one thermoelectric device; and a thermostatic controller for varying the current across the at least one thermoelectric device in response to fluctuations in temperature determined by said monitoring subsystem.

15. The modular cooling system as in claim 13 wherein the controller unit further comprises a maintenance control subsystem operationally connected to the at least one thermoelectric device for providing continuous display of a status of said at least one thermoelectric device.

16. The modular cooling system as in claim 13 wherein the controller unit further comprises a communication interface for remote monitoring and modification of said operating conditions.

17. The modular cooling system as in claim 13 wherein said controller unit further comprises a defrost system producing defrost cycles by reversing the voltage across the at least one thermoelectric device.

18. The modular cooling system as in claim 12 wherein said wall is a bottom wall of the refrigeration unit.

19. The modular cooling system as in claim 12 wherein said wall is a side wall of the refrigeration unit.

20. The modular cooling system as in claim 12 wherein said at least one modular thermoelectric cooling/heating unit is installed through an opening of a side wall of the refrigeration unit and wherein each first heatsink of said at least one modular thermoelectric cooling/heating unit includes a plurality of heat radiating fins extending generally vertically to facilitate natural convection.

21. The modular cooling system as in claim 19 wherein each first heatsink of said at least one modular thermoelectric cooling/heating unit is located within an air conduit.

22. The modular cooling system as in claim 20 wherein said air conduit comprises a generally vertical air conduit.

23. The modular cooling system of claim 12, wherein said fluid comprises a gaseous fluid.

24. A cooling/heating system comprising:

a housing;

a thermally insulating partition in said housing to divide said housing into first and second conduits, said first conduit comprising a first inlet and a first outlet and said second conduit comprising a second inlet and a second outlet;

at least one thermoelectric cooling/heating unit as defined in claim 1 installed through an opening in said thermally insulating partition with the first heatsink located in the first conduit and the second heatsink located in the second conduit;

a first fluid circulating member associated to the first conduit and producing a first fluid stream in said first conduit from the first inlet to the first outlet whereby heat exchange is conducted between said first fluid stream and said first heatsink; and a second fluid circulating member associated to the second conduit and producing a second fluid stream in said second conduit from the second inlet to the second outlet whereby heat exchange is conducted between the second fluid stream and the second heatsink.

25. A cooling/heating system comprising:

a housing;

a thermally insulating partition in said housing to divide said housing into first and second conduits, said first conduit comprising a first inlet and a first outlet and said second conduit comprising a second inlet and a second outlet;

a plurality of thermoelectric cooling/heating units as defined in claim 1 installed through respective openings in said thermally insulating partition with the first heatsinks of said thermoelectric cooling/heating units located in the first conduit and the second heatsinks of said thermoelectric cooling/heating units located in the second conduit;

a first fluid circulating member associated to the first conduit and producing a first fluid stream in said first conduit from the first inlet to the first outlet whereby heat exchange is conducted between said first fluid stream and said first heatsinks; and a second fluid circulating member associated to the second conduit and producing a second fluid stream in said second conduit from the second inlet to the second outlet whereby heat exchange is conducted between the second fluid stream and the second heatsinks.

* * * * *